United States Patent
Chen et al.

(10) Patent No.: US 12,129,169 B2
(45) Date of Patent: Oct. 29, 2024

(54) SEMI-FINISHED PRODUCT OF ELECTRONIC DEVICE AND ELECTRONIC DEVICE

(71) Applicant: Merry Electronics Co., Ltd., Taichung (TW)

(72) Inventors: Jen-Yi Chen, Taichung (TW); Yueh-Kang Lee, Taichung (TW); Kai-Yu Jiang, Taichung (TW)

(73) Assignee: Merry Electronics Co., Ltd., Taichung (TW)

( * ) Notice: Subject to any disclaimer, the term of this patent is extended or adjusted under 35 U.S.C. 154(b) by 355 days.

(21) Appl. No.: 17/535,699

(22) Filed: Nov. 26, 2021

(65) Prior Publication Data

US 2022/0298010 A1     Sep. 22, 2022

Related U.S. Application Data

(60) Provisional application No. 63/163,066, filed on Mar. 19, 2021.

(30) Foreign Application Priority Data

Nov. 9, 2021   (TW) .................................. 110141622

(51) Int. Cl.
*B81B 7/00*     (2006.01)
*B81C 99/00*    (2010.01)

(52) U.S. Cl.
CPC ........ *B81C 99/0045* (2013.01); *B81B 7/0035* (2013.01); *B81B 2207/03* (2013.01)

(58) Field of Classification Search
CPC . B81C 99/0045; B81C 99/004; B81B 7/0035; B81B 2207/03; B81B 2201/0257; B81B 2207/012; H04R 19/04; H04R 29/00
See application file for complete search history.

(56) References Cited

U.S. PATENT DOCUMENTS

2022/0040736 A1\*  2/2022  Umezawa ................ H03H 9/02

FOREIGN PATENT DOCUMENTS

WO    WO-2022000794 A1 \*  1/2022

\* cited by examiner

*Primary Examiner* — Moazzam Hossain
(74) *Attorney, Agent, or Firm* — JCIPRNET (57) ABSTRACT

Provided is a semi-finished product of an electronic device, including a substrate, a sensing module, and a lid. The substrate has a first surface and a second surface opposite to each other. The sensing module is disposed on the first surface. The lid is disposed on the first surface and forms a first cavity together with the substrate. An electronic device is also provided.

11 Claims, 6 Drawing Sheets

SEMI-FINISHED PRODUCT OF ELECTRONIC DEVICE AND ELECTRONIC DEVICE

CROSS-REFERENCE TO RELATED APPLICATION

This application claims the priority benefit of U.S. provisional application Ser. No. 63/163,066, filed on Mar. 19, 2021 and Taiwanese application no. 110141622, filed on Nov. 9, 2021. The entirety of the above-mentioned patent application is hereby incorporated by reference herein and made a part of this specification.

BACKGROUND

Technical Field

The disclosure relates to a semi-finished product and a device. Particularly, the disclosure relates to a semi-finished product of an electronic device and an electronic device.

Description of Related Art

Generally speaking, for a finished electronic device, tests are often performed thereon. However, as the structure of the electronic device trends toward complication, test difficulty of the electronic device at the stage of finished product also increases. Therefore, how to further reduce the test difficulty of the electronic device while designing for improvement in the performance of the electronic device may be a challenge.

SUMMARY

The disclosure provides a semi-finished product of an electronic device and an electronic device, for which while test difficulty of the electronic device is reduced, sensitivity of the electronic device can be effectively corrected, thus improving the performance of the finished electronic device.

In the disclosure, a semi-finished product of an electronic device includes a substrate, a sensing module, and a lid. The substrate includes a first surface and a second surface opposite to each other. The substrate has a first through hole and a second through hole. The sensing module is disposed on the first surface. The lid is disposed on the first surface and forms a first cavity together with the substrate. The sensing module is disposed in the first cavity. The sensing module has a second cavity. The first through hole is in corresponding communication with the first cavity. The second through hole is in corresponding communication with the second cavity.

In an embodiment of the disclosure, a correction sensitivity test of the semi-finished product is performed through air pressure.

In an embodiment of the disclosure, the lid has an opening configured for communication between air in the first cavity and air from outside.

In an embodiment of the disclosure, the lid is in direct contact with the substrate.

In an embodiment of the disclosure, the sensing module includes a wall structure, a sensor, and a pressurizing assembly. The wall structure is disposed on the first surface. The sensor is disposed on the first surface and covers the second through hole. The pressurizing assembly disposed on the wall structure and the sensor. The pressurizing assembly includes a mass and a diaphragm.

In an embodiment of the disclosure, the mass is disposed in the second cavity or the mass is disposed outside the second cavity.

In the disclosure, an electronic device includes a first substrate, a sensing module, a second substrate, and a lid. The first substrate includes a first surface and a second surface opposite to each other. The first substrate has a first through hole and a second through hole. The sensing module is disposed on the first surface. The second substrate is disposed on the second surface. The first substrate and the second substrate are electrically connected. The lid is disposed on the first surface and forms a first cavity together with the first substrate. The sensing module is disposed in the first cavity. The sensing module has a second cavity. The first through hole is in corresponding communication with the first cavity. The second through hole is in corresponding communication with the second cavity.

In an embodiment of the disclosure, the electronic device further includes a back chamber between the sensing module and the second substrate. An air in the back chamber is in flow communication with an air in the first cavity.

In an embodiment of the disclosure, the second substrate includes a conductive bump. The conductive bump is connected to the second surface of the first substrate and spaces out an extension chamber of the back chamber.

In an embodiment of the disclosure, an air in the extension chamber is in flow communication with the air in the back chamber through the second through hole.

In an embodiment of the disclosure, an air in the extension chamber is in flow communication with the air in the first chamber through the first through hole.

In an embodiment of the disclosure, the lid and the second substrate are separated by the first substrate.

In an embodiment of the disclosure, the lid is not in direct contact with the second substrate.

In an embodiment of the disclosure, the second substrate includes a seal ring. An edge of the seal ring is aligned with an edge of the second substrate.

In an embodiment of the disclosure, the lid has an opening configured for communication between air in the first cavity and air from outside.

In an embodiment of the disclosure, the lid is in direct contact with the first substrate.

In an embodiment of the disclosure, the sensing module includes a wall structure, a sensor, and a pressurizing assembly. The wall structure is disposed on the first surface. The sensor disposed on the first surface and covers the second through hole. The pressurizing assembly is disposed on the wall structure and the sensor. The pressurizing assembly includes a mass and a diaphragm.

In an embodiment of the disclosure, the mass is disposed in the second cavity or the mass is disposed outside the second cavity.

Based on the foregoing, in the disclosure, the lid is disposed on the surface of the substrate to form a cavity so as to manufacture a semi-finished product of an electronic device. As such, by the design of testing cavity, the electronic device can be tested instantly at the stage of semi-finished product. Therefore, while test difficulty of the electronic device is reduced, sensitivity of the electronic device can be effectively corrected, thus improving the performance of the electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated

It should be noted that some members are omitted for clarity of illustration in the top views of FIG. 1B and FIG. 1D.

DESCRIPTION OF THE EMBODIMENTS

The directional terms (e.g., up, down, right, left, front, rear, top, bottom) are used herein only for reference to the drawings and are not intended to imply absolute orientations.

Reference is made to the drawings and embodiments for more comprehensive description of the disclosure. Nonetheless, the disclosure may also be embodied in various forms, and should not be limited to the embodiments described herein. The thicknesses, dimensions, or sizes of the layers or regions in the drawings may be exaggerated for clarity. The same or similar reference numerals refer to the same or similar elements, and will not be repeatedly described one by one in the following paragraphs.

Figure 1A:
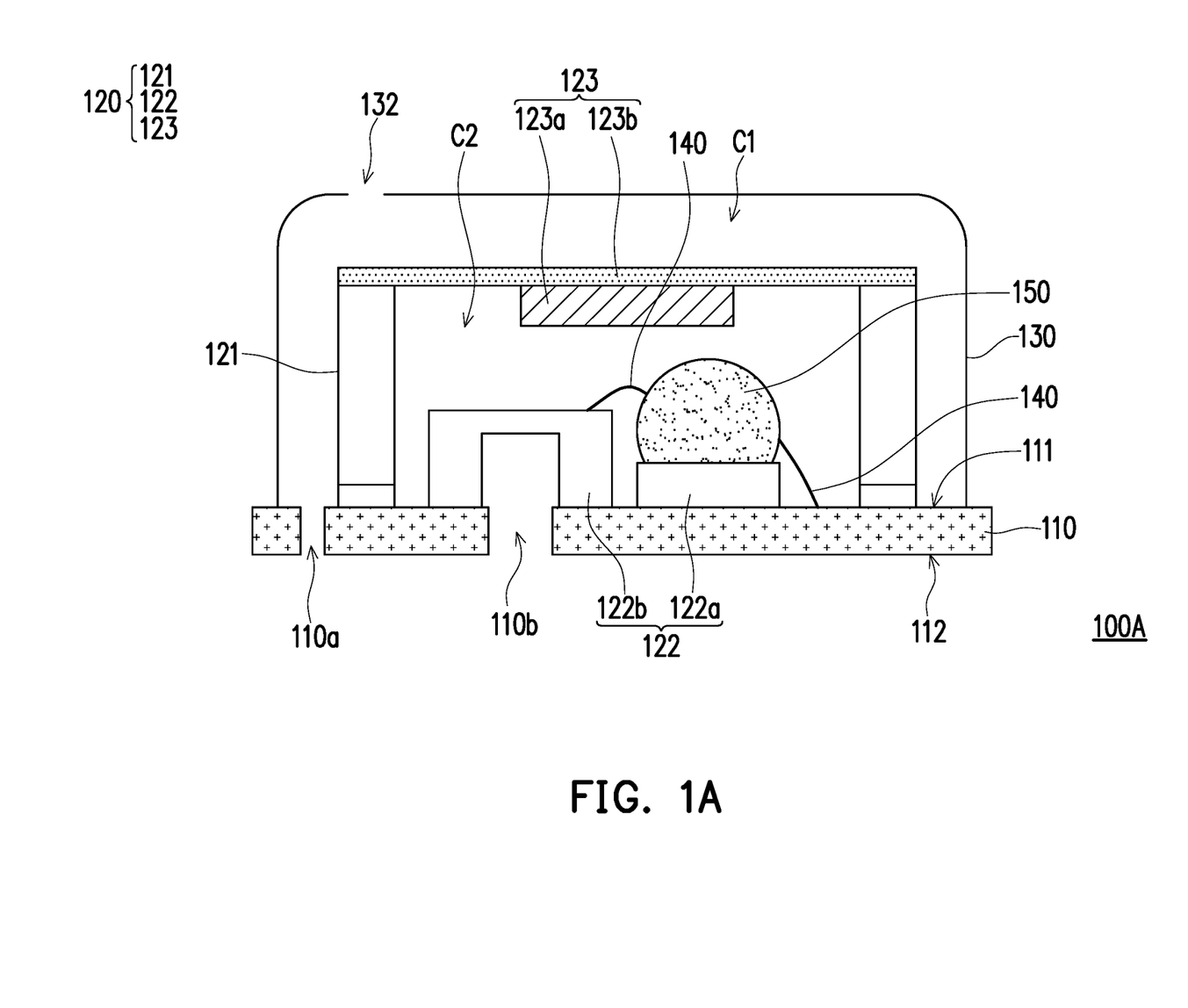
FIG. 1A is a schematic cross-sectional view of a semi-finished product of an electronic device according to an embodiment of the disclosure.
Figure 1B:
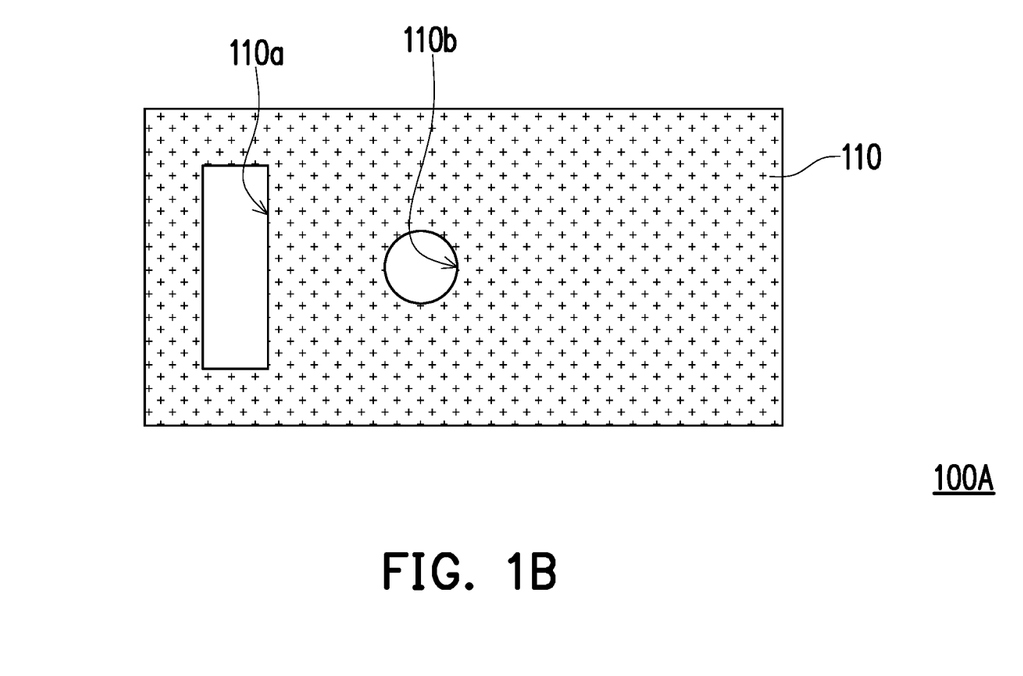
FIG. 1B is a schematic top view of FIG. 1A.

FIG. 1A is a schematic cross-sectional view of a semi-finished product of an electronic device according to an embodiment of the disclosure. FIG. 1B is a schematic top view of FIG. 1A.

With reference to FIG. 1A and FIG. 1B, in this embodiment, a semi-finished product of an electronic device 100A includes a substrate 110 (which may be a first substrate), a sensing module 120, and a lid 130. The substrate 110 has a first surface 111 and a second surface 112 opposite to each other. Further, the sensing module 120 is disposed on the first surface 111. Moreover, the lid 130 is disposed on the first surface 111 and forms a first cavity C1 together with the substrate 110. Accordingly, in this embodiment, the lid 130 is disposed on the first surface 111 of the substrate 110 to form the first cavity C1 to manufacture a semi-finished product of an electronic device 100A. As such, by the design of testing cavity (the first cavity C1), tests can be performed instantly on an electronic device at the stage of semi-finished product. Therefore, while test difficulty of the electronic device is reduced, sensitivity of the electronic device can be effectively corrected. Further, in this embodiment, by the design of testing cavity (the first cavity C1) of the semi-finished product of an electronic device 100A, a correction sensitivity test of the electronic device may be performed by air pressure at the stage of semi-finished product. In other words, changes of air pressure is controlled to test and correct the sensitivity of the sensing module to replace steps of test and correction with actual vibration. Therefore, while test difficulty of the electronic device is reduced, sensitivity of the electronic device can be effectively corrected.

In some embodiments, the lid 130 is in direct contact with the substrate 110. Therefore, tests may be performed on the semi-finished product of an electronic device 100A without disposing another substrate, but the disclosure is not limited thereto.

In some embodiments, the sensing module 120 is disposed in the first cavity C1, and the sensing module 120 has a second cavity C2. The substrate 110 has a first through hole 110a in corresponding communication with the first cavity C1 and a second through hole 110b in corresponding communication with the second cavity C2. In addition, the sensing module 120 may include a wall structure 121, a sensor 122, and a pressurizing assembly 123. The wall structure 121 is disposed on the first surface 111, the sensor 122 is disposed on the first surface 111 and covers the second through hole 110b, and the pressurizing assembly 123 is disposed on the wall structure 121 and the sensor 122. Further, the sensor 122 may include a processing chip 122a and a sensing chip 122b. Moreover, the pressurizing assembly 123 includes a mass 123a and a diaphragm 123b.

In some embodiments, the processing chip 122a may be an application specific integrated circuit (ASIC), to receive and process signals detected by a microphone element. The sensing chip 122b may be a microphone element to sense changes of air pressure caused by vibration of the pressurizing assembly 123 (the pressurizing assembly 123 may generate associated vibration along with the external vibration, compressing air in the second cavity C2). Nonetheless, the disclosure is not limited thereto.

In some embodiments, the substrate 110 is a circuit substrate. For example, the substrate 110 is, for example, a printed circuit board (PCB). In addition, the material of the wall structure 121 includes steel, copper, or a printed circuit board. The material of the mass 123a is metal (e.g., steel or copper). The material of the diaphragm 123b is plastics (e.g., polytetrafluoroethene (PTFE), polytetrafluoroethene (PE), polyimide (PI), or polyether ether ketone (PEEK)). Nonetheless, the disclosure is not limited thereto. Any other suitable material may be used in replacement for each of the above elements.

In some embodiments, the sensing chip 122b covers the second through hole 110b, and the dimension of the sensing chip 122b is greater than the second through hole 110b. In other words, an orthogonal projection of the sensing chip 122b on the substrate 110 completely covers the second through hole 110b, but the disclosure is not limited thereto.

In some embodiments, the first through hole 110a and the second through hole 110b have different shapes. For example, as shown in FIG. 1B, the first through hole 110a may be a strip-shaped hole, and the second through hole 110b may be a circular hole, but the disclosure is not limited thereto. The first through hole 110a and the second through hole 110b may be adjusted and combined depending on the actual design requirements.

In some embodiments, the semi-finished product of an electronic device 100A further includes multiple bonding wires 140 and an insulating layer 150 disposed on the sensing module 120. The material of the bonding wires 140 is, for example, gold or other suitable conductive materials, and the material of the insulating layer 150 is, for example, epoxy or other suitable insulating materials, which is not limited by the disclosure.

In some embodiments, one of the bonding wires 140 may connect the processing chip 122a and the sensing chip 122b to form an electrical connection between the processing chip 122a and the sensing chip 122b. In addition, another one of the bonding wires 140 may connect the processing chip 122*a* and the substrate 110 to form an electrical connection between the processing chip 122*a* and the substrate 110. Moreover, the insulating layer 150 may protect the bonding wires 140 to increase the reliability of the subsequent electronic device, but the disclosure is not limited thereto.

In some embodiments, the mass 123*a* is disposed in the second cavity C2, but the disclosure is not limited thereto. In other embodiments, the mass 123*a* may have other different configurations.

In some embodiments, the first cavity C1 and the second cavity C2 are two independent cavities. In other words, the first cavity C1 and the second cavity C2 are separated, but the disclosure is not limited thereto.

In some embodiments, the lid 130 has an opening 132 configured for communication between air in the first cavity C1 and air from the outside. Therefore, pressure in the first cavity C1 may be released at appropriate time, but the disclosure is not limited thereto. It should be noted that the size, quantity, and shape of the opening 132 may be determined depending on the actual design requirements, and all variants belong to the protection scope of the disclosure as long as they may serve for releasing the pressure in the first cavity C1. Here, the pressure in the first cavity C1 may be generated by a high temperature process during the process of manufacturing.

Here, it should be noted that the reference numerals of elements and part of the content in the above embodiment remain to be used in the following embodiments, where the same or similar reference numerals are used to refer to the same or similar elements, and the description of the same technical content is omitted. Reference may be made to the above embodiment for the description of the omitted part, which will not be repeatedly described in the following embodiments.

Figure 1C:
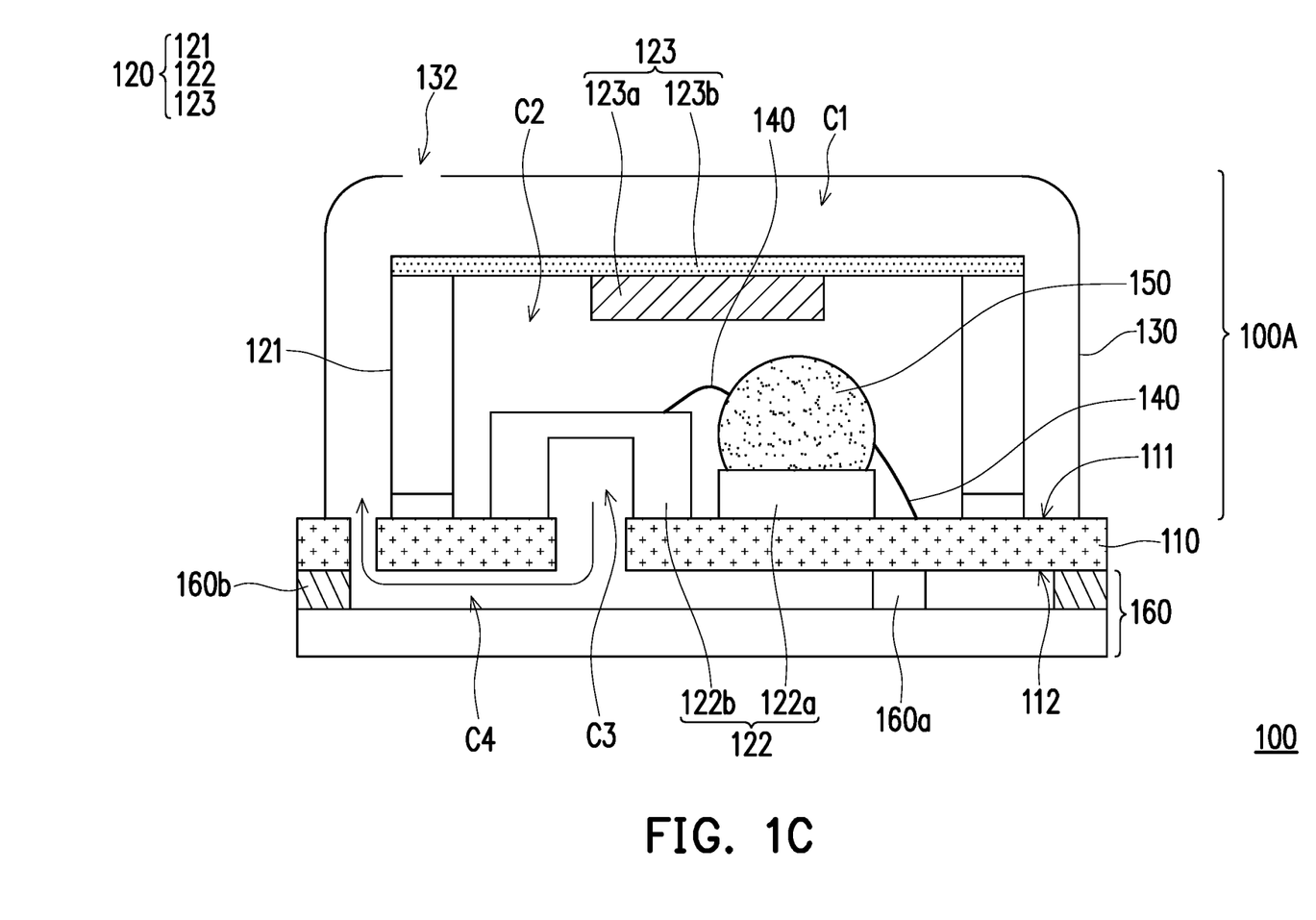
FIG. 1C is a schematic cross-sectional view of an electronic device according to an embodiment of the disclosure.
Figure 1D:
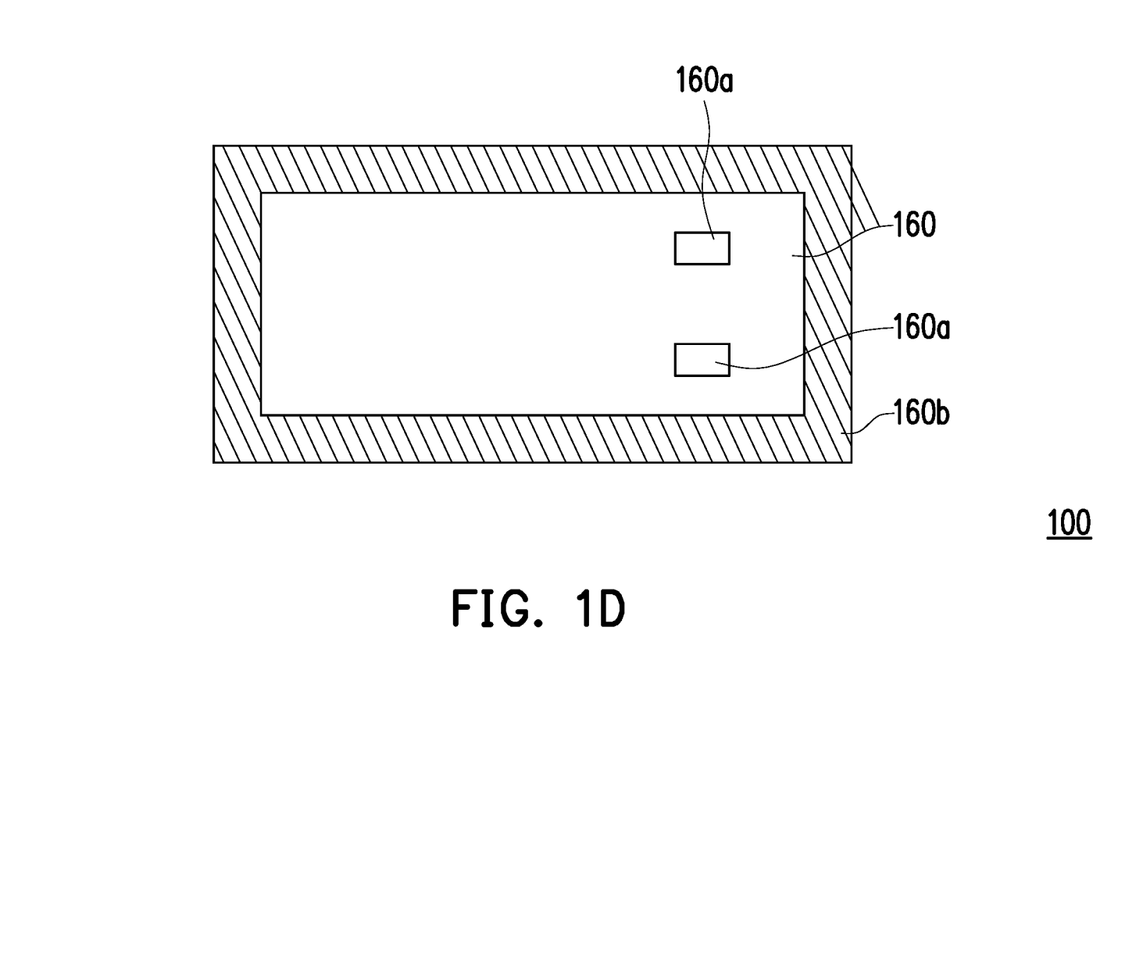
FIG. 1D is a schematic top view of FIG. 1C.

FIG. 1C is a schematic cross-sectional view of an electronic device according to an embodiment of the disclosure. FIG. 1D is a schematic top view of FIG. 1C.

With reference to FIG. 1C and FIG. 1D following FIG. 1A and FIG. 1B, an electronic device 100 may be manufactured from the semi-finished product of an electronic device 100A. The electronic device 100 includes the substrate 110, the sensing module 120, and the lid 130 of the semi-finished product of an electronic device 100A. In addition, the electronic device 100 further includes another substrate 160 (which may be a second substrate) disposed on the second surface 112 of the substrate 110, and the substrate 110 and the substrate 160 are electrically connected. Accordingly, for the electronic device 100 of this embodiment, at the stage of semi-finished product of an electronic device 100A, correction sensitivity test is instantly performed through the semi-finished product of an electronic device 100A. As a result, while test difficulty of the electronic device 100 is reduced, sensitivity of the electronic device 100 can be effectively corrected, thus improving the performance of the finished electronic device 100.

In some embodiments, a back chamber C3 is further included between the sensing module 120 and the substrate 160, and an air in the back chamber C3 is in flow communication with an air in the first cavity C1. In addition, the substrate 160 includes a conductive bump 160*a* and a seal ring 160*b*. The conductive bump 160*a* is connected to the second surface 112 of the first substrate 110 and spaces out an extension chamber C4 of the back chamber C3. Further, an air in the extension chamber C4 is in flow communication with the air in the back chamber C3 through the second through hole 110*b*, and is in flow communication with the air in the first cavity C1 through the first through hole 110*a*. As a result, the air in the back chamber C3 can be in flow communication with the air in the first cavity C1 through the extension chamber C4, thus achieving an increase in the chamber space of the back chamber C3 and improvement in the sensitivity of the sensing module 120, as shown in FIG. 1D. Nonetheless, the disclosure is not limited thereto.

In some embodiments, the substrate 160 is similar to the substrate 110. For example, the substrate 160 may be a circuit substrate, for example, a printed circuit board (PCB). The material of the conductive bump 160*a* is solder or a conductive silver paste. The material of the seal ring 160*b* is solder or a heat-resistant adhesive material. Nonetheless, the disclosure is not limited thereto. Any other suitable material may be used in replacement for each of the above elements.

In some embodiments, an edge of the seal ring 160*b* is aligned with an edge of the substrate 160, so the seal ring 160*b* may be located on the periphery of the substrate 160, but the disclosure is not limited thereto.

In some embodiments, the lid 130 and the substrate 160 are separated by the substrate 110. In other words, the substrate 110 is sandwiched between the lid 130 and the substrate 160, but the disclosure is not limited thereto.

In some embodiments, the lid 130 is not in direct contact with the second substrate 160, but the disclosure is not limited thereto.

Figure 2A:
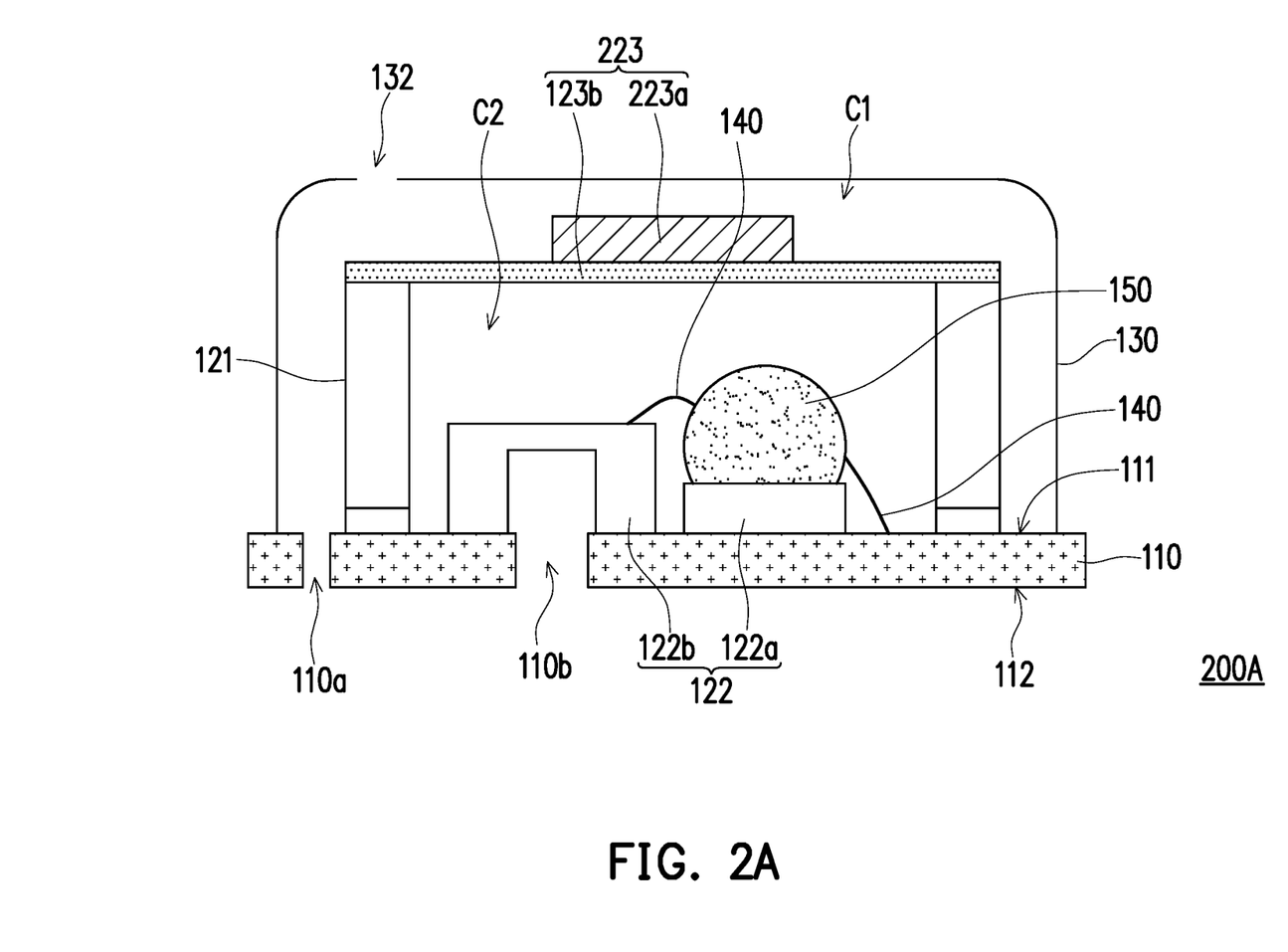
FIG. 2A is a schematic cross-sectional view of a semi-finished product of an electronic device according to another embodiment of the disclosure.
Figure 2B:
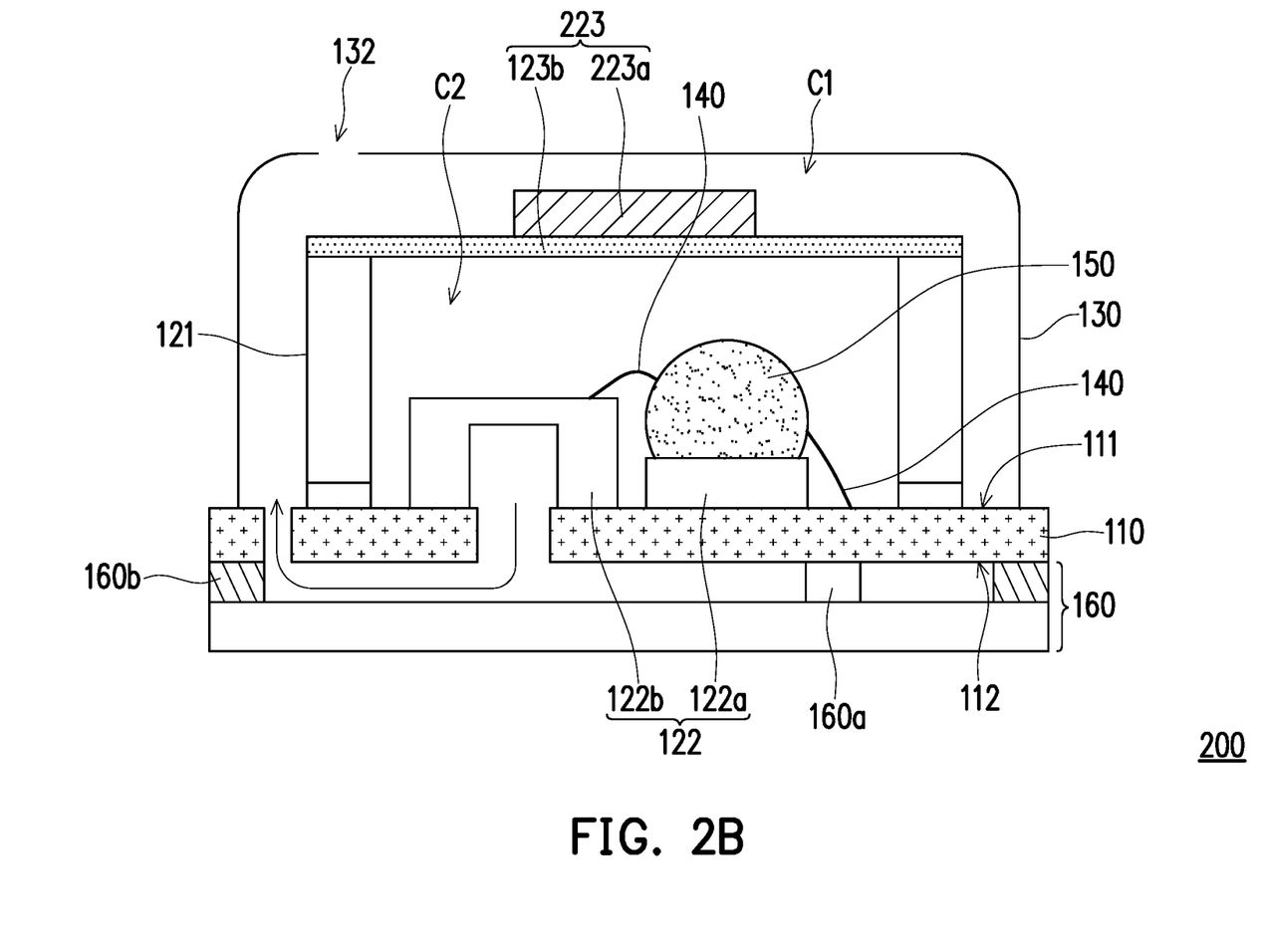
FIG. 2B is a schematic cross-sectional view of an electronic device according to another embodiment of the disclosure.

FIG. 2A is a schematic cross-sectional view of a semi-finished product of an electronic device according to another embodiment of the disclosure. FIG. 2B is a schematic cross-sectional view of an electronic device according to another embodiment of the disclosure. With reference to FIG. 2A, compared with the semi-finished product of an electronic device 100A, in a semi-finished product of an electronic device 200A of this embodiment, a mass 223*a* of a pressurizing assembly 223 is disposed outside the second cavity C2. In addition, with reference to FIG. 2B, an electronic device 200 is manufactured from the semi-finished product of an electronic device 200A. Further, in this embodiment, the mass 223*a* of the pressurizing assembly 223 may be located in the first cavity C1. Therefore, the mass 223*a* may be located between the lid 130 and the diaphragm 123*b*, and the diaphragm 123*b* may be located between the mass 223*a* and the sensor 122, but the disclosure is not limited thereto.

In summary of the foregoing, in the disclosure, by the design of testing cavity, a correction sensitivity test of the electronic device may be performed by air pressure at the stage of semi-finished product. In other words, changes of air pressure is used to test and instantly correct the sensitivity of the sensing module, to thus replace steps of test and correction with actual vibration. Therefore, while test difficulty of the electronic device is reduced, sensitivity of the electronic device can be effectively corrected.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a first substrate comprising a first surface and a second surface opposite to each other, the first substrate having a first through hole and a second through hole;
   a sensing module disposed on the first surface;
   a second substrate disposed on the second surface, wherein the first substrate and the second substrate are electrically connected, and an extension chamber is formed between the first substrate and the second substrate; and a lid disposed on the first surface and forming a first cavity together with the first substrate, wherein the sensing module is disposed in the first cavity, the sensing module has a second cavity, the first through hole is in corresponding communication with the first cavity, the second through hole is in corresponding communication with the second cavity, and an air in the extension chamber is in flow communication with an air in the first cavity and the second cavity through the first through hole and the second through hole.

2. The electronic device according to claim 1, further comprising a back chamber between the sensing module and the second substrate, wherein an air in the back chamber is in flow communication with an air in the first cavity.

3. The electronic device according to claim 2, wherein the second substrate comprises at least one conductive bump, and the conductive bump is connected to the second surface of the first substrate and spaces out the extension chamber of the back chamber.

4. The electronic device according to claim 3, wherein an air in the extension chamber is in flow communication with the air in the back chamber through the second through hole.

5. The electronic device according to claim 1, wherein the lid and the second substrate are separated by the first substrate.

6. The electronic device according to claim 1, wherein the lid is not in contact with the second substrate.

7. The electronic device according to claim 1, wherein the second substrate comprises a seal ring, and an edge of the seal ring is aligned with an edge of the second substrate.

8. The electronic device according to claim 1, wherein the lid has an opening configured for communication between air in the first cavity and air from outside.

9. The electronic device according to claim 1, wherein the lid is in direct contact with the first substrate.

10. The electronic device according to claim 1, wherein the sensing module comprises:
a wall structure disposed on the first surface;
a sensor disposed on the first surface and covering the second through hole; and
a pressurizing assembly disposed on the wall structure and the sensor, wherein the pressurizing assembly comprises a mass and a diaphragm.

11. The electronic device according to claim 10, wherein the mass is disposed in the second cavity or the mass is disposed outside the second cavity.

* * * * *